(12) United States Patent
Hara et al.

(10) Patent No.: US 11,036,135 B2
(45) Date of Patent: Jun. 15, 2021

(54) CURABLE COMPOSITION, CURED PRODUCT THEREOF, AND CURING METHOD THEREFOR

(71) Applicant: ADEKA CORPORATION, Tokyo (JP)

(72) Inventors: Kenji Hara, Tokyo (JP); Masatomi Irisawa, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 101 days.

(21) Appl. No.: 16/463,180

(22) PCT Filed: Nov. 21, 2017

(86) PCT No.: PCT/JP2017/041910
§ 371 (c)(1),
(2) Date: May 22, 2019

(87) PCT Pub. No.: WO2018/097147
PCT Pub. Date: May 31, 2018

(65) Prior Publication Data
US 2020/0073239 A1 Mar. 5, 2020

(30) Foreign Application Priority Data

Nov. 25, 2016 (JP) .............................. JP2016-229023

(51) Int. Cl.
| | |
|---|---|
| *G03F 7/038* | (2006.01) |
| *C08F 290/12* | (2006.01) |
| *G03F 7/027* | (2006.01) |
| *C08F 261/04* | (2006.01) |
| *G03F 7/033* | (2006.01) |
| *C08F 2/50* | (2006.01) |
| *C08F 2/44* | (2006.01) |
| *C09D 4/06* | (2006.01) |

(52) U.S. Cl.
CPC .............. *G03F 7/038* (2013.01); *C08F 2/44* (2013.01); *C08F 2/50* (2013.01); *C08F 261/04* (2013.01); *C08F 290/126* (2013.01); *C09D 4/06* (2013.01); *G03F 7/027* (2013.01); *G03F 7/033* (2013.01); *G03F 7/0388* (2013.01)

(58) Field of Classification Search
CPC ........ G03F 7/038; G03F 7/0388; G03F 7/027; G03F 7/033; C08F 2/50; C08F 290/126; C08F 2/44; C08F 261/04; C09D 4/06
USPC ....................................................... 430/270.1
See application file for complete search history.

(56) References Cited

U.S. PATENT DOCUMENTS

| | | | |
|---|---|---|---|
| 4,957,852 A | 9/1990 | Bronstert | |
| 6,136,507 A | 10/2000 | Morigaki | |
| 7,767,381 B2 * | 8/2010 | Ichimura | ................. C09D 4/06 430/281.1 |

(Continued)

FOREIGN PATENT DOCUMENTS

| | | |
|---|---|---|
| EP | 0 313 220 A2 | 4/1989 |
| EP | 0 313 221 A2 | 4/1989 |
| JP | 64-029836 A | 1/1989 |
| JP | 2-118575 A | 5/1990 |
| JP | 4-240644 A | 8/1992 |
| JP | 11-258797 A | 9/1999 |
| JP | 2003-215801 A | 7/2003 |
| JP | 2006-321047 A | 11/2006 |
| JP | 5147096 B2 | 2/2013 |
| JP | 5684714 B2 | 3/2015 |

OTHER PUBLICATIONS

International Search Report (PCT/ISA/210) issued in PCT/JP2017/041910, dated Feb. 27, 2018.

(Continued)

*Primary Examiner* — Caleen O Sullivan
(74) *Attorney, Agent, or Firm* — Birch, Stewart, Kolasch & Birch, LLP

(57) ABSTRACT

Provided are: a curable composition having excellent photolithographic properties and resin elution properties; a cured product of the curable composition; and a curing method of the curable composition. The curable composition is characterized by including: (A) at least one selected from the group consisting of a water-soluble polyfunctional (meth)acrylates and water-soluble polyfunctional (meth)acrylamides; and (B) a photosensitive group-containing water-soluble polymer. The water-soluble polyfunctional (meth)acrylates are preferably compounds represented by Formula (I) below, and the water-soluble polyfunctional (meth)acrylamides are preferably compounds represented by Formula (II) below. In Formulae (I) and (II), $R^1$ represents a hydrogen atom, a methyl group, or a halogen atom; $X^1$ represents an alkylene group having 1 to 6 carbon atoms that is optionally substituted with a hydroxy group; A represents an n-valent organic group; $R^{11}$ represents a hydrogen atom or an alkyl group having 1 to 4 carbon atoms; m represents a number of 1 to 30; n represents a number of 2 to 12; and t represents a number of 2 to 12.

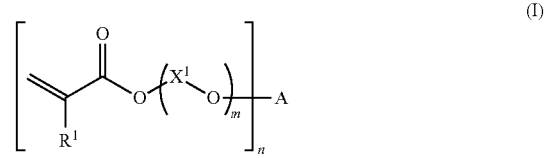

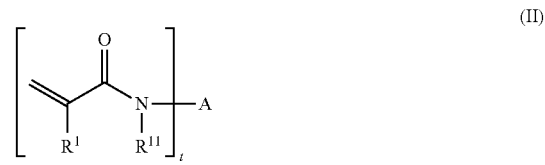

10 Claims, No Drawings

(56) References Cited

U.S. PATENT DOCUMENTS

2003/0190548 A1    10/2003    Furukawa et al.

OTHER PUBLICATIONS

Written Opinion (PCT/ISA/237) issued in PCT/JP2017/041910, dated Feb. 27, 2018.

\* cited by examiner

CURABLE COMPOSITION, CURED PRODUCT THEREOF, AND CURING METHOD THEREFOR

TECHNICAL FIELD

The present invention relates to a curable composition; a cured product of the same; and a curing method of the same. More particularly, the present invention relates to: a curable composition having excellent photolithographic properties and resin elution properties; a cured product of the curable composition; and a curing method of the curable composition.

BACKGROUND ART

Today, a variety of photosensitive group-containing polymers are known as resins that are insolubilized by irradiation with light, and a myriad of proposals have been made with regard to compositions containing such polymers. For example, as a UV-curable ink that has excellent ink acceptability in an ink-jet system and exhibits excellent adhesion with polycarbonate substrates and the like, Patent Document 1 proposes a UV-curable ink which contains a water-soluble acrylate monomer, a polyvinylpyrrolidone-vinyl acetate copolymer as a water-soluble polymer and a urethane acrylate oligomer, and in which the water content is 5% by weight or less with respect to a total weight.

Further, as an exterior paint having excellent water resistance, weather resistance and the like, Patent Document 2 proposes a multicolor paint composition which contains colored gel particles obtained by dispersing a water-based color paint that contain a synthetic resin emulsion, a gel-forming substance and a coloring pigment in a gelling agent-containing aqueous medium, wherein the synthetic resin emulsion is an emulsified polymer of monomers containing an alkyl (meth)acrylate as a main component, and the monomers have a carboxyl group-containing monomer ratio of not higher than 3% by weight. Moreover, as an adhesive for cycloolefin polymers, Patent Document 3 proposes a resin composition which contains: a (meth)acrylate having a dicyclopentenyl group; a (meth)acrylate having a hydroxy group; an oligomer that has a diene-based skeleton or a hydrogenated diene-based skeleton and contains no (meth)acryloyl group; a silane coupling agent; a photopolymerization initiator; and a (meth)acrylic acid.

RELATED ART DOCUMENTS

Patent Documents

[Patent Document 1] JP2006-321047A
[Patent Document 2] JP5147096B2
[Patent Document 3] JP5684714B2

SUMMARY OF THE INVENTION

Problems to be Solved by the Invention

The above-described compositions proposed in Patent Documents 1 to 3 contain a water-soluble polyfunctional (meth)acrylate and a water-soluble polymer. However, films formed from these compositions are not sufficient in terms of photolithographic properties, resin elution properties and the like; therefore, a composition having all of these properties at high levels is desired.

In view of the above, an object of the present invention is to provide: a curable composition having excellent photolithographic properties and resin elution properties; a cured product of the curable composition; and a curing method of the curable composition.

Means for Solving the Problems

The present inventors intensively studied to solve the above-described problems and consequently discovered that the above-described problems can be solved by adopting the following constitution in a curable composition, thereby completing the present invention.

That is, a curable composition of the present invention is characterized by containing: (A) at least one selected from the group consisting of water-soluble polyfunctional (meth)acrylates and water-soluble polyfunctional (meth)acrylamides; and (B) a photosensitive group-containing water-soluble polymer.

In the curable composition of the present invention, the water-soluble polyfunctional (meth)acrylates are preferably compounds represented by the following Formula (I):

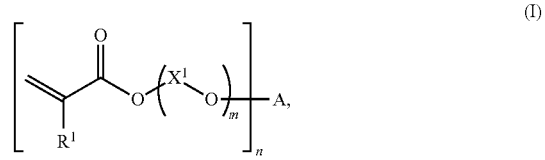

(I)

where $R^1$ represents a hydrogen atom, a methyl group, or a halogen atom; $X^1$ represents an alkylene group having 1 to 6 carbon atoms that is optionally substituted with a hydroxy group; A represents an n-valent organic group; m represents a number of 1 to 30; and n represents a number of 2 to 12, and the water-soluble polyfunctional (meth)acrylamides are preferably compounds represented by the following Formula (II):

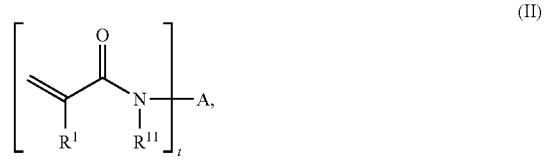

(II)

where $R^{11}$ represents a hydrogen atom or an alkyl group having 1 to 4 carbon atoms; t represents a number of 2 to 12; and $R^1$ and A have the same meanings as in the above-described Formula (I).

In the curable composition of the present invention, it is preferred that the (B) photosensitive group-containing water-soluble polymer be a water-soluble polymer containing a structural unit represented by the following Formula (III) or (IV):

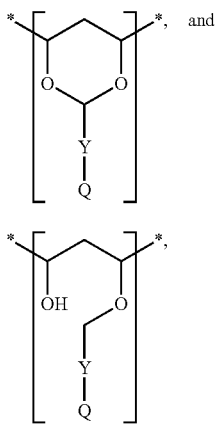

where Y represents a divalent organic group; and Q represents a photosensitive group, or a water-soluble polymer containing a structural unit represented by the following Formula (V):

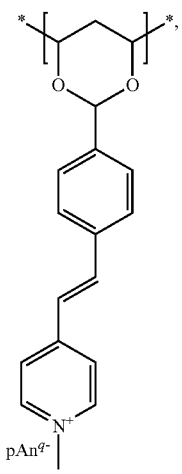

where $An^{q-}$ represents a q-valent anion; q represents 1 or 2; and p represents a coefficient that maintains a neutral charge.

In the curable composition of the present invention, it is also preferred that Q in the above-describe Formulae (III) and (IV) be a vinyl group, an allyl group, a styryl group, a cinnamyl group, a cinnamoyl group, a cinnamylidene group, a cinnamylideneacetyl group, a chalcone group, a coumarin group, an isocoumarin group, a 2,5-dimethoxystilbene group, a maleimide group, an α-phenylmaleimide group, a 2-pyrone group, an azide group, a thymine group, a quinone group, a maleimide group, a uracil group, a pyrimidine group, a stilbazolium group, a styrylpyridinium group, a styrylquinolium group, an epoxy group, an oxetane group, a vinyl ether group, an allyl ether group, an acetylacetone structure, or a β-diketone structure. Further, in the curable composition of the present invention, it is preferred that the (B) photosensitive group-containing water-soluble polymer be a polyvinyl alcohol derivative obtained by introducing a (meth)acrylate or (meth)acrylamide structure to a polyvinyl alcohol. Still further, it is preferred that the curable composition of the present invention further contains a radical initiator.

A cured product of the present invention is characterized in that it is obtained by curing the curable composition of the present invention.

A curing method of the present invention is characterized by including curing the curable composition of the present invention with an active energy ray.

Effects of the Invention

According to the present invention, a curable composition having excellent photolithographic properties and resin elution properties as well as a cured product and curing method of the same can be provided. The curable composition of the present invention not only has excellent heat resistance, water resistance, and moist-heat resistance, but also exhibits good resin elution properties and thus excellent anti-liquid-crystal contamination properties; therefore, the curable composition of the present invention is useful as an adhesive for various functional films used in flat panel displays, particularly as an adhesive that directly comes in contact with liquid crystal, such as a sealant for liquid-crystal dropping process.

Mode for Carrying Out the Invention

The curable composition of the present invention, the cured product of the same and the curing method of the same will now be described in detail. The curable composition of the present invention contains: (A) at least one selected from the group consisting of water-soluble polyfunctional (meth)acrylates and water-soluble polyfunctional (meth)acrylamides (hereinafter, also referred to as "component (A)"); and (B) a photosensitive group-containing water-soluble polymer (hereinafter, also referred to as "component (B)"). These components are described below in the order mentioned.

<Water-Soluble Polyfunctional (Meth)acrylates and Water-Soluble Polyfunctional (Meth)acrylamides>

Examples of the water-soluble polyfunctional (meth)acrylates according to the component (A) of the curable composition of the present invention include polyfunctional (meth)acrylates that dissolve in water; polyfunctional (meth)acrylates that are dispersed in water and emulsified; and polyfunctional (meth)acrylates that dissolve in alkaline water, and examples of their structures include those having at least one group selected from the group consisting of an ethylene oxide group, a propylene oxide group, a hydroxy group and a carboxyl group that are hydrophilic functional groups in the molecule; or those modified with ethylene oxide or propylene oxide. It is noted here that the term "(meth)acrylates" used herein means acrylates and methacrylates.

Examples of the water-soluble polyfunctional (meth)acrylates include alkylene glycol di(meth)acrylates, such as polyethylene glycol diacrylate, trimethylolpropane triacrylate, ethylene glycol di(meth)acrylate, 1,4-cyclohexane dimethanol (meth)acrylate, propylene glycol di(meth)acrylate, and butylene glycol di(meth)acrylate; dialkylene glycol di(meth)acrylates, such as diethylene glycol di(meth)acrylate, dipropylene glycol di(meth)acrylate, and dibutylene glycol di(meth)acrylate; trialkylene glycol di(meth)acrylates, such as triethylene glycol di(meth)acrylate, tripropylene glycol di(meth)acrylate, and tributylene glycol di(meth)acrylate; tetraalkylene glycol di(meth)acrylates, such as tetraethylene glycol di(meth)acrylate, tetrapropylene glycol di(meth)acrylate, and tetrabutylene glycol di(meth)acrylate; polyalkylene glycol di(meth)acrylates, such as polyethylene glycol di(meth)acrylate, polypropylene glycol di(meth)acrylate, and polybutylene glycol di(meth)acrylate; polyether tri(meth)acrylate; 1,4-butanediol glycidyl ether di(meth)acrylate; 1,6-hexanediol glycidyl ether di(meth)acrylate; diethylene glycol diglycidyl ether di(meth)acrylate; dipropylene glycol diglycidyl ether di(meth)acrylate; carboxypolycaprolactone mono(meth)acrylate; phthalic acid mono-hydroxyethyl (meth)acrylate; and 2-hydroxy-3-phenoxypropyl (meth)acrylate.

Among the above-described water-soluble polyfunctional (meth)acrylates, those having a structure represented by the followingFormula (I) or a structure represented by Formula (VI) below are preferred because of their high affinity to water.

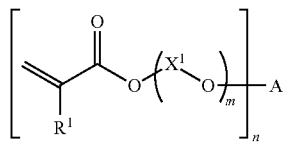

(I)

In Formula (I), $R^1$ represents a hydrogen atom, a methyl group, or a halogen atom; $X^1$ represents an alkylene group having 1 to 6 carbon atoms that is optionally substituted with a hydroxy group; A represents an n-valent organic group; m represents a number of 1 to 30; and n represents a number of 2 to 12.

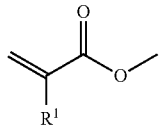

(VI)

In Formula (VI), $R^1$ has the same meaning as in Formula (I).

In Formula (I), examples of the halogen atom represented by $R^1$ include chlorine, bromine, iodine, and fluorine. Further, examples of the alkylene group having 1 to 6 carbon atoms that is represented by $X^1$ include methylene, ethylene, propylene, butylene, and isobutylene.

In Formula (I), the n-valent organic group represented by A can also be represented by the following Formula (1) when n is 2.

$$*-Z^1-X^2-Z^2-* \quad (1).$$

In Formula (1), $X^2$ represents a single bond, $-CR^{30}R^{31}-$, $-NR^{32}-$, a divalent aliphatic hydrocarbon group having 1 to 35 carbon atoms, a divalent aromatic hydrocarbon group having 6 to 35 carbon atoms, a divalent heterocyclic group having 2 to 35 carbon atoms, or a substituent represented by any one of Formulae (2) to (4) below, the aliphatic hydrocarbon group being optionally interrupted by $-O-$, $-S-$, $-CO-$, $-COO-$, $-OCO-$, or $-NH-$, or by a ligand in which these groups are combined without oxygen atoms being adjacent to each other; $R^{30}$ and $R^{31}$ each represent a hydrogen atom, an alkyl group having 1 to 8 carbon atoms, an aryl group having 6 to 20 carbon atoms, or an arylalkyl group having 7 to 20 carbon atoms; $Z^1$ and $Z^2$ each independently represent a direct bond, $-O-$, $-S-$, $>CO$, $-CO-O-$, $-O-CO-$, $-SO_2-$, $-SS-$, $-SO-$, or $>NR^{33}$; and $R^{32}$ and $R^{33}$ each represent a hydrogen atom, an optionally substituted aliphatic hydrocarbon group having 1 to 35 carbon atoms, an optionally substituted aromatic hydrocarbon group having 6 to 35 carbon atoms, or an optionally substituted heterocyclic group having 2 to 35 carbon atoms. It is noted here that the symbols "*" mean that this group is bound with adjacent groups at the sites "*".

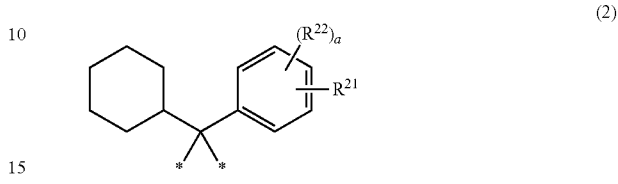

(2)

In Formula (2), $R^{21}$ represents a hydrogen atom, an optionally substituted phenyl group, or a cycloalkyl group having 3 to 10 carbon atoms; $R^{22}$ represents an alkyl group having 1 to 10 carbon atoms, an alkoxy group having 1 to 10 carbon atoms, an alkenyl group having 2 to 10 carbon atoms, or a halogen atom, wherein the alkyl group, the alkoxy group and the alkenyl group are optionally substituted; and a represents an integer of 0 to 5.

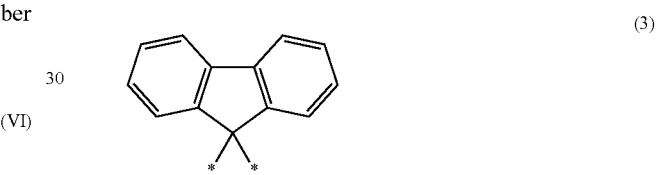

(3)

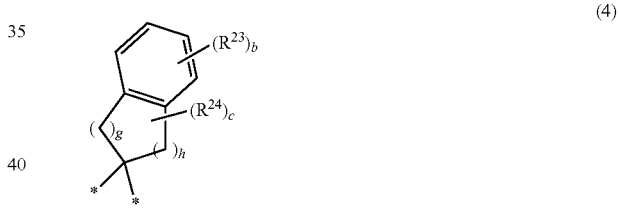

(4)

In Formula (4), $R^{23}$ and $R^{24}$ each independently represent an optionally substituted alkyl group having 1 to 10 carbon atoms, an optionally substituted aryl group having 6 to 20 carbon atoms, an optionally substituted aryloxy group having 6 to 20 carbon atoms, an optionally substituted arylthio group having 6 to 20 carbon atoms, an optionally substituted arylalkenyl group having 6 to 20 carbon atoms, an optionally substituted arylalkyl group having 7 to 20 carbon atoms, an optionally substituted heterocyclic group having 2 to 20 carbon atoms, or a halogen atom; a methylene group in the alkyl group and the arylalkyl group is optionally interrupted by an unsaturated bond, $-O-$, or $-S-$; $R^{23}$ optionally forms a ring with adjacent $R^{23}$; b represents a number of 0 to 4; c represents a number of 0 to 8; g represents a number of 0 to 4; h represents a number of 0 to 4; and a total of g and h is 2 to 4. The symbols "*" in Formulae (2) to (4) mean that these substituents are each bound with adjacent groups at the sites "*".

In Formula (I), the n-valent organic group represented by A can also be represented by the following Formula (5) when n is 3.

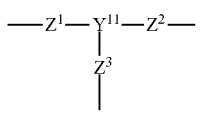
(5)

In Formula (5), $Y^{11}$ represents a single bond, a trivalent aliphatic hydrocarbon group having 3 to 35 carbon atoms, a trivalent alicyclic hydrocarbon group having 3 to 35 carbon atoms, a trivalent aromatic hydrocarbon group having 6 to 35 carbon atoms, or a trivalent heterocyclic group having 2 to 35 carbon atoms; $Z^1$, $Z^2$ and $Z^3$ each independently represent a direct bond, —O—, —S—, >CO, —CO—O—, —O—CO—, —SO$_2$—, —SS—, —SO—, >NR$^{32}$, >PR$^{32}$, an optionally substituted aliphatic hydrocarbon group having 1 to 35 carbon atoms, an optionally substituted aromatic hydrocarbon group having 6 to 35 carbon atoms, or an optionally substituted heterocyclic group having 2 to 35 carbon atoms; $R^{32}$ represents a hydrogen atom, an optionally substituted aliphatic hydrocarbon group having 1 to 35 carbon atoms, an optionally substituted aromatic hydrocarbon group having 6 to 35 carbon atoms, or an optionally substituted heterocyclic group having 2 to 35 carbon atoms; and the above-described aliphatic hydrocarbon groups are each optionally interrupted by a carbon-carbon double bond, —O—, —CO—, —O—CO—, —CO—O— or —SO$_2$—.

In Formula (I), the n-valent organic group represented by A can also be represented by the following Formula (6) when n is 4.

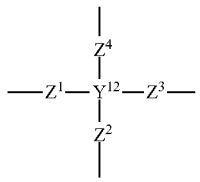
(6)

In Formula (6), $Y^{12}$ represents a single bond, a carbon atom, a tetravalent aliphatic hydrocarbon group having 1 to 35 carbon atoms, a tetravalent aromatic hydrocarbon group having 6 to 35 carbon atoms, or a tetravalent heterocyclic group having 2 to 35 carbon atoms, the aliphatic hydrocarbon group being optionally interrupted by —COO—, —O—, —OCO—, —NHCO—, —NH— or —CONH—; and $Z^1$ to $Z^4$ each independently have the same meaning as $Z^1$ to $Z^3$ in Formula (5).

In Formula (I), the n-valent organic group represented by A can also be represented by the following Formula (7) when n is 5.

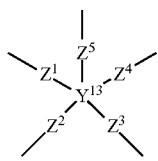
(7)

In Formula (7), $Y^{13}$ represents a single bond, a pentavalent aliphatic hydrocarbon group having 2 to 35 carbon atoms, a pentavalent aromatic hydrocarbon group having 6 to 30 carbon atoms, or a pentavalent heterocyclic group having 2 to 30 carbon atoms, the aliphatic hydrocarbon group being optionally interrupted by —COO—, —O—, —OCO—, —NHCO—, —NH— or —CONH—; and $Z^1$ to $Z^5$ each independently have the same meaning as $Z^1$ to $Z^3$ in Formula (5).

In Formula (I), the n-valent organic group represented by A can also be represented by the following Formula (8) when n is 6.

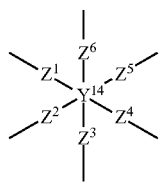
(8)

In Formula (8), $Y^{14}$ represents a single bond, a hexavalent aliphatic hydrocarbon group having 2 to 35 carbon atoms, a hexavalent aromatic hydrocarbon group having 6 to 35 carbon atoms, or a hexavalent heterocyclic group having 2 to 35 carbon atoms, the aliphatic hydrocarbon group being optionally interrupted by —COO—, —O—, —OCO—, —NHCO—, —NH— or —CONH—; and $Z^1$ to $Z^6$ each independently have the same meaning as $Z^1$ to $Z^3$ in Formula (5).

In the curable composition of the present invention, it is preferred that m and n in Formula (I) be 5 to 20 and 3 to 8, respectively, since a high affinity to water is attained.

Preferred examples of the water-soluble polyfunctional (meth)acrylates specifically include the followings.

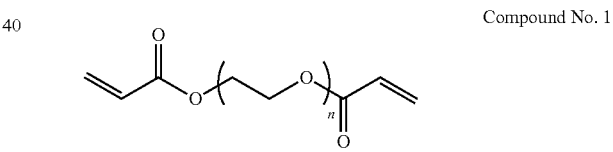

Compound No. 1 n = 10 ~ 30

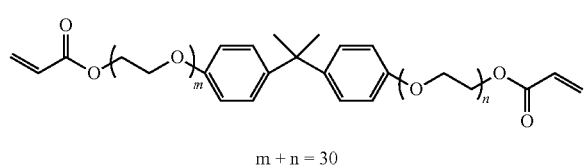

Compound No. 2 m + n = 30

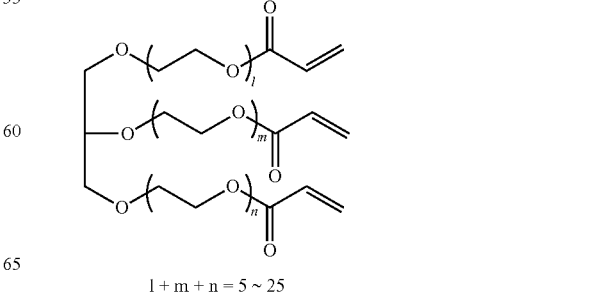

Compound No. 3 l + m + n = 5 ~ 25

-continued

Compound No. 4

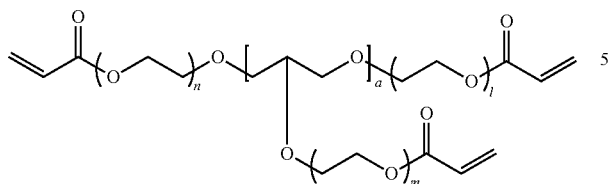

m + l + n = 20 ~ 60

Compound No. 5

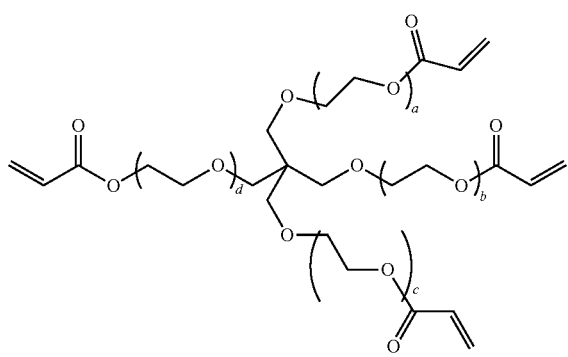

a + b + c + d = 35

Compound No. 6

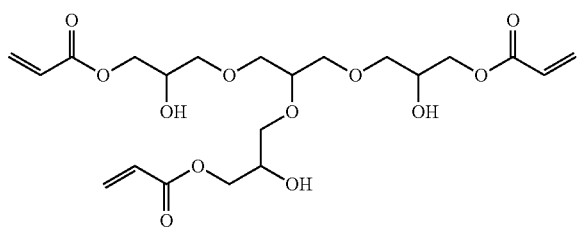

Compound No. 7

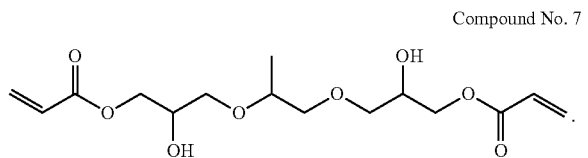 [SMILES: C=CC(=O)OCC(O)COCC(C)OCC(O)COC(=O)C=C]

As the water-soluble polyfunctional (meth)acrylates, commercially available products can be used as well, and examples thereof include A-GLY-9E, A-GLY-20E, A-600, A-1000, A-BPE-30, ATM-35E, A-PG5027E, A-PG5054E, 14G; GLY-9E, and GLY-20E (which are manufactured by Shin Nakamura Chemical Co., Ltd.); PEG400DA-D and EBECRYL 11 (which are manufactured by DAICEL-ALL-NEX Ltd.); and 9EG-A and 14EG-A (which are manufactured by Kyoeisha Chemical Co., Ltd.).

Examples of the water-soluble polyfunctional (meth)acrylamides according to the component (A) of the curable composition of the present invention include polyfunctional (meth)acrylamides that dissolve in water; polyfunctional (meth)acrylamides that are dispersed in water and emulsified; and polyfunctional (meth)acrylamides that dissolve in alkaline water. It is noted here that the term "(meth)acrylamides" used herein means acrylamides and methacrylamides.

Among the above-described water-soluble polyfunctional (meth)acrylamides, ones having a structure represented by the following Formula (II) are preferred because of their high affinity to water.

$$\left[ \begin{array}{c} O \\ \| \\ R^1 \end{array} \begin{array}{c} N-A \\ | \\ R^{11} \end{array} \right]_t \quad (II)$$

In Formula (II), $R^{11}$ represents a hydrogen atom or an alkyl group having 1 to 4 carbon atoms; t represents a number of 2 to 12; and $R^1$ and A have the same meanings as in the above-described Formula (I).

Examples of the alkyl group having 1 to 4 carbon atoms include a methyl group, an ethyl group, a propyl group, an isopropyl group, an n-butyl group, an isobutyl group, and a t-butyl group. Unless otherwise specified, any of the above-exemplified groups can be preferably used as the below-described alkyl group having 1 to 4 carbon atoms.

Examples of such water-soluble polyfunctional (meth)acrylamides include N,N-methylene-bisacrylamide, N-[tris(3-acrylamidepropoxymethyl)methyl](meth)acrylamide, N,N'-diacryloyl-4,7,10-trioxa-1,13-tridecanediamine, N,N',N''-triacryloyldiethylenetriamine, N,N'-{[2-acrylamide-2-[(3-acylamidepropoxy)methyl]propane-1,3-diyl]bis(oxy)}bis(propane-1,3-diyl)}diacrylamide, and N,N,N',N''-tetraacryloyltriethylenetetramine.

In the curable composition of the present invention, as the water-soluble polyfunctional (meth)acrylamides, ones having a substituent, such as a hydroxyalkyl group, on their nitrogen atoms can be used as well.

Preferred examples of the water-soluble polyfunctional (meth)acrylamides specifically include the followings.

Compound No. 8

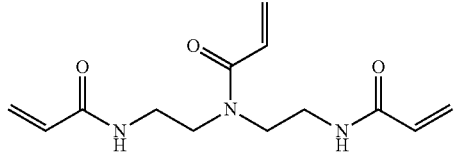

Compound No. 9

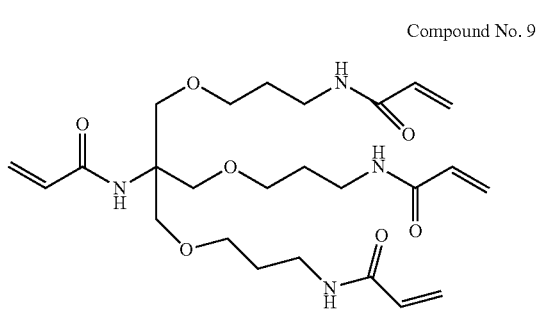

Compound No. 11

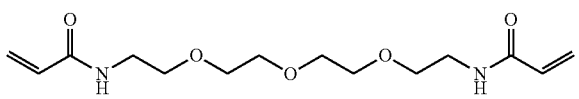

Compound No. 12

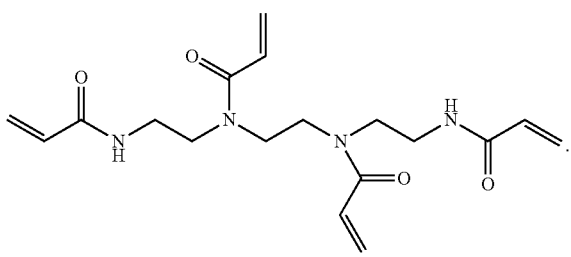

As the water-soluble polyfunctional (meth)acrylamides, commercially available products can be used as well, and examples thereof include FFM-2, FFM-3, FFM-4, and FFM-5.

In the curable composition of the present invention, the component (A) may be used individually, or two or more thereof may be used in combination at an arbitrary ratio.

<Photosensitive Group-Containing Water-Soluble Polymer>

Examples of the (B) photosensitive group-containing water-soluble polymer according to the curable composition of the present invention include polyvinyl alcohols; polyvinyl alcohol derivatives modified with a silanol group or the like; polyvinyl alcohol derivatives obtained by introducing a (meth)acrylate or (meth)acrylamide structure to a polyvinyl alcohol; oxidized starch; etherified, esterified or grafted modified starch; cellulose derivatives, such as gelatin, casein, and carboxymethylcellulose; polyvinylpyrrolidones; water-soluble resins, such as water-soluble polyester resins, water-soluble polyacrylic acid ester resins, water-soluble polycarbonate resins, water-soluble polyvinyl acetate resins, water-soluble styrene acrylate resins, water-soluble vinyltoluene acrylate resins, water-soluble polyurethane resins, water-soluble polyamide resins, water-soluble urea resins, water-soluble polycaprolactone resins, water-soluble polystyrene resins, water-soluble polyvinyl chloride resins, water-soluble polyacrylate resins, and water-soluble polyacrylonitrile resins; water-soluble polymers, such as styrene-butadiene copolymers, acrylate copolymers, polyvinyl acetates, and ethylene-vinyl acetate copolymers, in which a photosensitive group, such as a vinyl group, an allyl group, a styryl group, a cinnamyl group, a cinnamoyl group, a cinnamylidene group, a cinnamylideneacetyl group, a chalcone group, a coumarin group, an isocoumarin group, a 2,5-dimethoxystilbene group, a maleimide group, an α-phenylmaleimide group, a 2-pyrone group, an azide group, a thymine group, a quinone group, a maleimide group, a uracil group, a pyrimidine group, a stilbazolium group, a styrylpyridinium group, a styrylquinolium group, an epoxy group, an oxetane group, a vinyl ether group, an allyl ether group, an acetylacetone structure, or a β-diketone structure, is introduced; water-soluble polymers, such as styrene-butadiene copolymers, acrylate copolymers, polyvinyl acetates, and ethylene-vinyl acetate copolymers, which are grafted with a (meth)acrylate having a hydroxy group, a carbonyl group, a formyl group or the like, or with a (meth)acrylamide having a hydroxy group.

As the (B) photosensitive group-containing water-soluble polymer, a water-soluble polymer containing a structural unit represented by the following Formula (III) or (IV) is preferred from the availability standpoint.

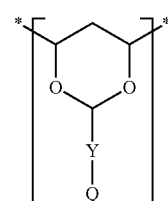 (III)

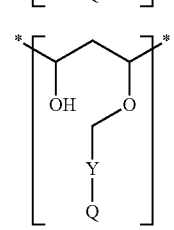 (IV)

In Formula (III) or (IV), Y represents a divalent organic group, and Q represents a photosensitive group. Further, the symbols "*" mean that each structural unit is bound with adjacent groups at the sites "*".

In Formula (III) or (IV), examples of the divalent organic group represented by Y include the same ones as those exemplified above for A in Formula (I), and an alkylene group having 1 to 6 carbon atoms or a phenylene group is particularly preferred from the availability standpoint.

In Formula (III) or (IV), as the photosensitive group represented by Q, a functional group having a photo-dimerizable unsaturated bond can be used, and examples thereof include a vinyl group, an allyl group, a styryl group, a cinnamyl group, a cinnamoyl group, a cinnamylidene group, a cinnamylideneacetyl group, a chalcone group, a coumarin group, an isocoumarin group, a 2,5-dimethoxystilbene group, a maleimide group, an α-phenylmaleimide group, a 2-pyrone group, an azide group, a thymine group, a quinone group, a maleimide group, a uracil group, a pyrimidine group, a stilbazolium group, a styrylpyridinium group, a styrylquinolium group, an epoxy group, an oxetane group, a vinyl ether group, an allyl ether group, an acetylacetone structure, and a β-diketone structure. These polymers are made insoluble in a solvent due to crosslinking of the photosensitive group, which is caused by dimerization reaction of the photosensitive group with light to yield a 4-membered ring composed of carbon atoms, or due to a reaction of an ethylenically unsaturated bond of a vinyl group, an allyl group, a (meth)acryl group or the like through addition polymerization.

Among such (B) photosensitive group-containing water-soluble polymers represented by Formula (III) or (IV), those having a structural unit represented by the following Formula (V) are preferred from the reactivity standpoint.

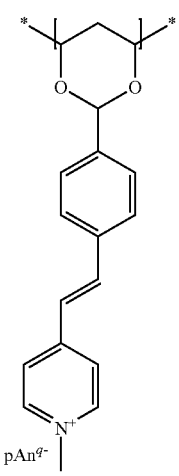

(V)

In Formula (V), $An^{q-}$ represents a q-valent anion; q represents 1 or 2; and p represents a coefficient that maintains a neutral charge.

It is preferred that the (B) photosensitive group-containing water-soluble polymer have a polymerization degree of 100 to 5,000, a weight-average molecular weight of 10,000 to 200,000 and a saponification degree (hydrolysis rate) of 85 to 100, since the water resistance is improved and the durability of the resulting film is improved.

The (B) photosensitive group-containing water-soluble polymer represented by Formula (III) or (IV) can be obtained by acetalization reaction of a polyvinyl alcohol and a photosensitive group-containing aldehyde under a condition of pH 5 to 7.

Among such (B) photosensitive group-containing water-soluble polymers represented by Formula (III) or (IV), those in which Q is a styrylpyridinium group or an acetoacetate group are preferred because of their high water resistance and heat resistance, and those represented by the following Formula (VII) are more preferred.

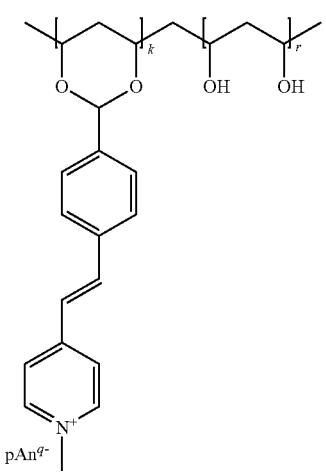

(VII)

In Formula (VII), $An^{q-}$, q and p have the same meanings as in Formula (V), and $100<k+r<3,000$.

In the curable composition of the present invention, a commercially available product can be used as the component (B), and examples thereof include BIOSURFINE-AWP (manufactured by Toyo Gosei Co., Ltd.) and AQUASOL HS (manufactured by Murakami Co., Ltd.).

In the curable composition of the present invention, the component (B) may be used individually, or two or more thereof may be used in combination at an arbitrary ratio.

In the curable composition of the present invention, the mass ratio of the components (A) and (B) is preferably 5:95 to 90:10. By satisfying this range, the heat resistance, the water resistance, the moist-heat resistance, the photolithographic properties and the resin elution properties can be balanced at a high level. The mass ratio of the components (A) and (B) is more preferably 10:90 to 80:20, particularly preferably 15:75 to 60:40.

<Other Components>

In the curable composition of the present invention, a radical initiator, a sensitizer, a coupling agent, a crosslinking agent, and a solvent may also be incorporated as required.

As the radical initiator, a conventionally known compound can be used, and examples of the photoradical initiator that can be used include those described in JPS57-197289A, JPH06-228218A, JP2009-102455A and JP2012-007071A, JP2016-510314A and WO2014/050551A1, as well as hydrogen abstraction-type photopolymerization initiators, such as benzophenone, thioxanthone, carboxybenzophenone and salts thereof, dicarboxybenzophenone and salts thereof, 1-chloro-4-propoxythioxanthone, isopropylthioxanthone, diethylthioxanthone, and ethylanthraquinone; and photolytic photopolymerization initiators, such as phenyl biphenyl ketone, 1-hydroxy-1-benzoylcyclohexane (α-hydroxyalkylphenone), benzoin, benzyl dimethyl ketal, 1-benzyl-1-dimethylamino-1-(4'-morpholinobenzoyl)propane, 2-morpholyl-2-(4'-methylmercapto)benzoylpropane, 4-benzoyl-4'-methyldiphenyl sulfide, benzoin butyl ether, 2-hydroxy-2-benzoylpropane, 2-hydroxy-2-(4'-isopropyl) benzoylpropane, 4-butylbenzoyltrichloromethane, 4-phenoxybenzoyldichloromethane, methyl benzoylformate, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 1,7-bis(9'-acridinyl) heptane, 9-n-butyl-3,6-bis(2'-morpholinoisobutyroyl) carbazole, 2-methyl-4,6-bis(trichloromethyl)-s-triazine, 2-phenyl-4,6-bis(trichloromethyl)-s-triazine, 2-naphthyl-4,6-bis(trichloromethyl)-s-triazine, 2,2-bis(2-chlorophenyl)-4,5,4',5'-tetraphenyl-1-2'-biimidazole, acylphosphine oxide, bis-acylphosphine oxide and triphenylphosphine oxide, among which photolytic photopolymerization initiators are preferred because of their reactivity.

Among photolytic photopolymerization initiators, for example, water-soluble initiators, such as IRGACURE® 2959 and IRGACURE® 819DW (which are manufactured by BASF Japan, Ltd.) and ESACURE ONE, ESACURE 1001M, ESACURE KIP 150 and ESACURE DP 250 (which are manufactured by Lamberti S.p.A) are preferred because of their high affinity to water. It is noted here that an initiator other than these water-soluble initiators, such as IRGACURE® 907, can be used as well.

As the above-described water-soluble initiators, compounds represented by Formulae (VIII) and (IX) below are also preferred because of their high affinity to water.

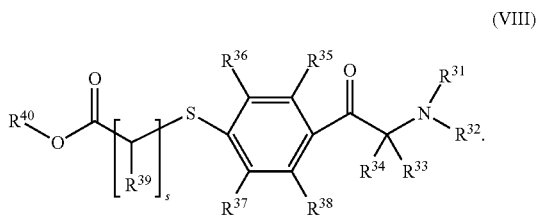 (VIII)

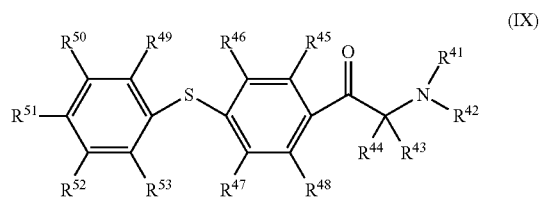 (IX)

In Formula (VIII), $R^{31}$ and $R^{32}$ each independently represent: a hydrogen atom; an alkyl group having 1 to 12 carbon atoms which is unsubstituted or substituted with a hydroxy group, a carboxyl group, a halogen atom, a cyano group or a nitro group; a phenyl group which is unsubstituted or substituted with an alkyl group having 1 to 4 carbon atoms, a hydroxy group, a carboxyl group, a halogen atom, a cyano group or a nitro group; an arylalkyl group which is unsubstituted or substituted with an alkyl group having 1 to 4 carbon atoms, a hydroxy group, a carboxyl group, a halogen atom, a cyano group or a nitro group; or an alkenyl group having 2 to 12 carbon atoms, and $R^{31}$ and $R^{32}$ are optionally linked together to form a 3 to 6-membered heterocycle.

In addition, $R^{33}$ and $R^{34}$ each independently represent: a hydrogen atom; an alkyl group having 1 to 12 carbon atoms which is unsubstituted or substituted with a hydroxy group, a carboxyl group, a halogen atom, a cyano group or a nitro group; a phenyl group which is unsubstituted or substituted with an alkyl group having 1 to 4 carbon atoms, a hydroxy group, a carboxyl group, a halogen atom, a cyano group or a nitro group; an arylalkyl group which is unsubstituted or substituted with an alkyl group having 1 to 4 carbon atoms, a hydroxy group, a carboxyl group, a halogen atom, a cyano group or a nitro group; or an alkenyl group having 2 to 12 carbon atoms, and $R^{33}$ and $R^{34}$ are optionally linked together to form a 3 to 6-membered heterocycle.

Further, $R^{35}$, $R^{36}$, $R^{37}$ and $R^{38}$ each independently represent a hydrogen atom, a halogen atom, a cyano group, a nitro group, a hydroxy group, or an alkyl group having 1 to 8 carbon atoms which is unsubstituted or substituted with a halogen atom.

Still further, $R^{39}$ each independently represents a hydrogen atom, a hydroxy group, a carboxyl group, a halogen atom or an alkyl group having 1 to 4 carbon atoms, and when s is 2 or larger, the plural $R^{39}$s are the same or different from each other.

Moreover, $R^{40}$ represents: a hydrogen atom; an alkyl group having 1 to 12 carbon atoms which is unsubstituted or substituted with a hydroxy group, a carboxyl group, a halogen atom, a cyano group or a nitro group; a phenyl group which is unsubstituted or substituted with an alkyl group having 1 to 4 carbon atoms, a hydroxy group, a carboxyl group, a halogen atom, a cyano group or a nitro group; or an arylalkyl group which is unsubstituted or substituted with an alkyl group having 1 to 4 carbon atoms, a hydroxy group, a carboxyl group, a halogen atom, a cyano group or a nitro group.

Furthermore, methylene chains in the above-described alkyl groups and arylalkyl groups are optionally substituted with —O— or —S—, and s represents a number of 1 to 12.

In Formula (IX), $R^{41}$ and $R^{42}$ each independently represent: a hydrogen atom; an alkyl group having 1 to 12 carbon atoms which is unsubstituted or substituted with a hydroxy group, a carboxyl group, a halogen atom, a cyano group or a nitro group; a phenyl group which is unsubstituted or substituted with an alkyl group having 1 to 4 carbon atoms, a hydroxy group, a carboxyl group, a halogen atom, a cyano group or a nitro group; an arylalkyl group having 7 to 30 carbon atoms which is unsubstituted or substituted with an alkyl group having 1 to 4 carbon atoms, a hydroxy group, a carboxyl group, a halogen atom, a cyano group or a nitro group; an alkenyl group having 2 to 12 carbon atoms; or an alkali metal atom, and $R^{41}$ and $R^{42}$ are optionally linked together to form a 3 to 6-membered heterocycle.

In addition, $R^{43}$ and $R^{44}$ each represent: a hydrogen atom; an alkyl group having 1 to 12 carbon atoms which is unsubstituted or substituted with a hydroxy group, a carboxyl group, a halogen atom, a cyano group or a nitro group; a phenyl group which is unsubstituted or substituted with an alkyl group having 1 to 4 carbon atoms, a hydroxy group, a carboxyl group, a halogen atom, a cyano group or a nitro group; an arylalkyl group having 7 to 30 carbon atoms which is unsubstituted or substituted with an alkyl group having 1 to 4 carbon atoms, a hydroxy group, an alkoxy group having 1 to 4 carbon atoms, an amino group, an alkylthio group having 1 to 4 carbon atoms, a carboxyl group, a halogen atom, cyano group or a nitro group; or an alkenyl group having 2 to 12 carbon atoms, and $R^{43}$ and $R^{44}$ are optionally linked together to form a 3 to 6-membered cyclic alkane.

Further, $R^{45}$, $R^{46}$, $R^{47}$, $R^{48}$, $R^{49}$, $R^{50}$, $R^{52}$ and $R^{53}$ each independently represent: a hydrogen atom; a halogen atom; a cyano group; a nitro group; a carboxyl group; a hydroxy group; an alkyl group having 1 to 8 carbon atoms which is unsubstituted or substituted with a halogen atom; or an arylalkyl group having 7 to 30 carbon atoms which is unsubstituted or substituted with an alkyl group having 1 to 4 carbon atoms, a hydroxy group, a carboxyl group, a halogen atom, a cyano group or a nitro group.

Still further, $R^{51}$ represents: a hydrogen atom; a halogen atom; a cyano group; a nitro group; a carboxyl group; a hydroxy group; an alkyl group having 1 to 8 carbon atoms which is unsubstituted or substituted with a halogen atom; an arylalkyl group having 7 to 30 carbon atoms which is unsubstituted or substituted with an alkyl group having 1 to 4 carbon atoms, a hydroxy group, a carboxyl group, a halogen atom, a cyano group or a nitro group; or —O$^-$M$^+$, and M represents an alkali metal.

In the curable composition of the present invention, the amount of the radical initiator to be added is preferably 0.1 to 10 parts by mass, more preferably 0.5 to 5 parts by mass, with respect to a total of 100 parts by mass of the components (A) and (B).

As the sensitizer, a compound that is capable of expanding the wavelength range of applicable light when curing is performed by irradiation with light can be used, and examples of such a compound include benzophenones, such as benzophenone, 3-hydroxybenzophenone, 4-hydroxybenzophenone, 4,4-dihydroxybenzophenone, 2-methylbenzophenone, 3-methylbenzophenone, 4-methylbenzophenone, 2,5-dimethylbenzophenone, 3,4-dimethylbenzophenone, 4-methoxybenzophenone, 4,4-dimethoxybenzophenone, 3,3-dimethyl-4-methoxybenzophenone, and 4-phenylbenzophenone; acetophenones, such as acetophenone, 4-methoxyacetophenone, 2,4-dimethoxyacetophenone, 2,5-dimethoxyacetophenone, 2,6-dimethoxyacetophenone, 4,4-dimethoxyacetophenone, 4-ethoxyacetophenone, diethoxyacetophenone, 2,2-diethoxyacetophenone, 2-ethoxy-2-phenylacetophenone, and 4-phenylacetophenone; anthraquinones, such as anthraquinone, hydroxyanthraquinone, 1-nitroanthraquinone, aminoanthraquinone, 2-chloroanthraquinone, 2-methylanthraquinone, 2-ethylanthraquinone, anthraquinone sulfonic acid, 1,2-benzanthraquinone, and 1,4-hydroxyanthraquinone (quinizarin); anthracenes, such as anthracene, 1,2-benzanthracene, 9-cyanoanthracene, 9,10-dicyanoanthracene, 2-ethyl-9,10-dimethoxyanthracene, and 9,10-bis(phenylethyl)anthracene; quinones, such as 2,3-dichloro-6-dicyano-p-benzoquinone, 2,3-dimethoxy-5-methyl-1,4-benzoquinone, methoxybenzoquinone, 2,5-dichloro-p-benzoquinone, 2,6-dimethyl-1,4-benzoquinone, 9,10-phenanthrenequinone, camphor quinone, 2,3-dichloro-1,4-naphthoquinone, and xanthone; thioxanes, such as thioxanthone, 2-methylthioxanthone, 2,4-dimethylthioxanthone, isopropylthioxanthone, 2,4-diethylthioxanthone, and 2,4-isopropylthioxanthone; cycloheptanes, such as dibenzosuberone, dibenzosuberenone, dibenzosuberenol, and dibenzosuberane; aromatic compounds, such as 2-methoxynaphthalene, benzoin isopropyl ether, 4-benzoyldiphenyl, o-benzoyl benzoate, methyl o-benzoylbenzoate, 4-benzoyl-4-methyl-diphenyl sulfide, benzyl, and benzoin methyl ether; and coumarin-based, thiazine-based, azine-based, acridine-based, and xanthene-based compounds that are dye-based sensitizing substances.

Examples of the coupling agent that can be used include alkyl functional alkoxysilanes, such as dimethyldimethoxysilane, dimethyldiethoxysilane, methylethyldimethoxysilane, methylethyldiethoxysilane, methyltrimethoxysilane, methyltriethoxysilane, ethyltrimethoxysilane, and ethyltrimethoxysilane; alkenyl functional alkoxysilanes, such as vinyltrichlorosilane, vinyltrimethoxysilane, vinyltriethoxysilane, and allyltrimethoxysilane; epoxy functional alkoxysilanes, such as 3-methacryloxypropyltriethoxysilane, 3-methacryloxypropyltrimethoxysilane, 3-methacryloxypropylmethyldiethoxysilane, 3-methacryloxypropylmethyldimethoxysilane, 2-methacryloxypropyltrimethoxysilane, γ-glycidoxypropyltrimethoxysilane, γ-glycidoxypropylmethyldiethoxysilane, and β-(3,4-epoxycyclohexyl)ethyltrimethoxysilane; amino functional alkoxysilanes, such as N-β(aminoethyl)-γ-aminopropyltrimethoxysilane, γ-aminopropyltriethoxysilane, and N-phenyl-γ-aminopropyltrimethoxysilane; mercapto functional alkoxysilanes, such as γ-mercaptopropyltrimethoxysilane; titanium alkoxides, such as titanium tetraisopropoxide and titanium tetra-n-butoxide; titanium chelates, such as titanium dioctyloxy-bis(octylene glycolate) and titanium diisopropoxy-bis(ethylacetoacetate); zirconium chelates, such as zirconium tetraacetyl acetonate and zirconium tributoxymonoacetyl acetonate; zirconium acylates, such as zirconium tributoxy monostearate; and isocyanate silanes, such as methyltriisocyanate silane.

Examples of the crosslinking agent include polyamines, polyols, dicyandiamide derivatives, hydrazine compounds, polyhydrazide compounds (dihydrazides and trihydrazides), aldehydes, methylol compounds, activated vinyl compounds, polyoxazoline compounds, carbodiimide compounds, epoxy compounds, polyisocyanate compounds, alkylene carbonate compounds of phenolic compounds, polyvalent metal salts, silane coupling agents, zirconium compounds, and titanium compounds.

The solvent is not particularly restricted as long as it is capable of dissolving or dispersing the above-described water-soluble polymer, and examples thereof include ketones, such as methyl ethyl ketone, methyl amyl ketone, diethyl ketone, acetone, methyl isopropyl ketone, methyl isobutyl ketone, cyclopentanone, cyclohexanone, and isophorone; ether-based solvents, such as ethyl ether, dioxane, tetrahydrofuran, 1,2-dimethoxyethane, 1,2-diethoxyethane, and dipropylene glycol dimethyl ether; ester-based solvents, such as methyl acetate, ethyl acetate, n-propyl acetate, isopropyl acetate, and n-butyl acetate; cellosolve-based solvents, such as ethylene glycol monomethyl ether, ethylene glycol monoethyl ether, propylene glycol monomethyl ether acetate, and cellosolve acetate; alcohol-based solvents, such as methanol, ethanol, iso- or n-propanol, iso- or n-butanol, amyl alcohols, and acetone alcohols; ether ester-based solvents, such as ethylene glycol monomethyl acetate, ethylene glycol monoethyl acetate, and propylene glycol methyl acetate; BTX-based solvents, such as benzene, toluene, and xylene; aliphatic hydrocarbon-based solvents, such as hexane, heptane, octane, and cyclohexane; terpene-based hydrocarbon oils, such as turpentine oil, D-limonene, and pinene; paraffin-based solvents, such as mineral spirit, SWASOL #310 (manufactured by COSMO Matsuyama Oil Co., Ltd.) and SOLVESSO #100 (manufactured by Exon Chemical Co., Ltd.); halogenated aliphatic hydrocarbon-based solvents, such as carbon tetrachloride, chloroform, trichloroethylene, tetrachloroethylene, methylene chloride, and 1,2-dichloroethane; halogenated aromatic hydrocarbon-based solvents, such as chlorobenzene; aprotic polar solvents, such as N,N-dimethylformamide, N-methylpyrrolidone, and dimethyl sulfoxide; carbitol-based solvents; aniline; triethylamine; pyridine; acetic acid; acetonitrile; carbon disulfide; and water. These solvents may be used individually, or two or more thereof may be used in combination as a mixed solvent.

Further, in the curable composition of the present invention, a surfactant can be used as required. Examples the surfactant that can be used include fluorine surfactants, such as perfluoroalkyl phosphates and perfluoroalkyl carboxylates; anionic surfactants, such as higher fatty acid alkali salts, alkyl sulfonates, and alkyl sulfates; cationic surfactants, such as higher amine halogen acid salts and quaternary ammonium salts; nonionic surfactants, such as polyethylene glycol alkyl ethers, polyethylene glycol fatty acid esters, sorbitan fatty acid esters, and fatty acid monoglycerides; amphoteric surfactants; and silicone-based surfactants, and these surfactants may be used in combination as well.

Moreover, as long as the effects of the present invention are not impaired, a variety of resin additives and the like, such as a thermal polymerization initiator, a photobase initiator, an inorganic filler, an organic filler, a coloring agent such as a pigment or a dye, an anti-foaming agent, a thickening agent, a leveling agent, an organic metal coupling agent, a thixotropic agent, a carbon compound, metal fine particles, a metal oxide, a flame retardant, a plasticizer, a light stabilizer, a heat stabilizer, an age inhibitor, elastomer particles, a chain transfer agent, a polymerization inhibitor, an ultraviolet absorber, an antioxidant, an antistatic agent, a mold-release agent, a flow modifier, and an adhesion-promoting agent, may be further incorporated as required.

The curable composition of the present invention can be applied onto a support substrate made of glass, metal, paper, plastic or the like using a known means, such as a spin coater, a bar coater, a roll coater or a curtain coater, or various printing or immersion means. Further, after once applying the curable composition of the present invention onto a support substrate such as a film, the resultant can be transferred onto another support substrate, and the method thereof is not restricted.

Specific examples of the use of the curable composition of the present invention include optical materials represented by eyeglasses and imaging lenses; paints; coating agents; lining agents; inks; resists; liquid resists; adhesives; sealing agents for liquid-crystal dropping method; printing boards; insulating varnishes; insulating sheets; laminated plates; printed circuit boards; sealants for semiconductor devices, LED packages, liquid crystal inlets, organic ELs, optical elements, electrical insulating materials, electronic components, separator membranes and the like; molding materials; putties; glass fiber impregnants; fillers; passivation films for semiconductors, solar cells and the like; interlayer insulating films; protective films; prism lens sheets used in backlights of liquid crystal displays; Fresnel lens sheets used in the screens of projection televisions and the like; lens parts of lens sheets (e.g., lenticular lens sheets) as well as backlights and the like using such sheets; protective films and spacers of liquid crystal color filters; DNA separation chips; biosensors; micro-reactors; nano-biodevices; recording materials for hard disks; solid-state image sensing devices; solar cell panels; light-emitting diodes; organic light-emitting devices; luminescent films; fluorescent films; MEMS elements; actuators; holograms; plasmon devices; polarizing plates; polarizing films; optical lenses such as microlenses; optical elements; optical connectors; optical waveguides; and casting agents for optical modeling, and examples of a substrate to which the curable composition of the present invention can be applied as a coating agent include products made of a metal, a wood material, a rubber, a plastic, a glass, a ceramic or the like.

In cases where the curable composition of the present invention is used as an adhesive, a method in which, after homogeneously mixing the curable composition of the present invention with other arbitrary components as appropriate and kneading the resulting mixture using an extruder, a roll or the like, the thus kneaded product is made into a sheet form by a film formation process such as calendaring, rolling, T-die extraction or inflation, and the resulting adhesive molded into a sheet form is pasted to a transparent support, after which the resultant is irradiated with light such as UV radiation from the transparent support side under the above-described conditions and then pasted to other adherend, may be employed. Alternatively, the adhesive may be irradiated with light after being adhered to the adherend.

Further, the curable composition of the present invention and the above-described additives may be homogeneously dissolved in a solvent that does not have any effect on a protective film or a liquid-crystal cell surface substrate, and the resulting solution may be uniformly coated on the surface of a transparent support by a printing method such as screen printing, gravure printing or flexographic printing, or by a coating method using a roll coater, a flow coater, a knife coater or the like, after which the resultant can be preliminarily press-bonded and then irradiated with light to be adhered and cured. When the surface to be adhered is relatively small, a method of allowing the adhesive to infiltrate into gaps between materials that are put together by its surface tension may be used.

For the irradiation with light, in addition to a photomask, for example, a multi-tone mask such as a gray-tone mask or a half-tone mask, or a high-precision mask called "reticle" can be used.

Examples of the material of the transparent support include inorganic materials, such as glass; cellulose esters, such as diacetyl cellulose, triacetyl cellulose (TAC), propionyl cellulose, butyryl cellulose, acetylpropionyl cellulose, and nitrocellulose; polyamides; polycarbonates; polyesters, such as polyethylene terephthalate, polyethylene naphthalate, polybutylene terephthalate, poly-1,4-cyclohexane dimethylene terephthalate, polyethylene-1,2-diphenoxyethane-4,4'-dicarboxylate, and polybutylene terephthalate; polystyrenes; polyolefins, such as polyethylenes, polypropylenes, and polymethylpentenes; acrylic resins, such as polymethyl methacrylate; polycarbonates; polysulfones; polyether sulfones; polyether ketones; polyether imides; and polymeric materials, such as polyoxyethylenes and norbornene resins. The transmittance of the transparent support is preferably 80% or higher, more preferably 86% or higher. The haze is preferably 2% or less, more preferably 1% or less. The refractive index is preferably 1.45 to 1.70.

In the irradiation with light, the irradiation conditions, such as the wavelength and the intensity of the light to be irradiated and the irradiation time, may be adjusted as appropriate in accordance with the activity of a photopolymerization initiator, the activity of a photopolymerizable resin to be used and the like; however, as for the wavelength of the light, usually, in order to allow the light to sufficiently penetrate to the inside, the light has a wavelength peak of preferably 350 to 400 nm, more preferably 360 to 380 nm. Further, the intensity of the light is preferably 10 to 300 mW/cm$^2$, more preferably 25 to 100 mW/cm$^2$, and the irradiation time is preferably 5 to 500 seconds, more preferably 10 to 300 seconds.

In the curable composition of the present invention, in order to reduce the viscosity and to improve the coatability, a liquid photopolymerizable acrylic monomer, a liquid photopolymerizable monovinyl monomer or a water-soluble monofunctional (meth)acrylamide can be used as a reactive diluent. The liquid photopolymerizable acrylic monomer is commercially available or can be produced by a well-known method. Examples of the liquid photopolymerizable monovinyl monomer include vinyl esters, such as vinyl acetate; monoacrylic esters, such as alkylacrylate, alkyl methacrylate, hydroxyalkyl methacrylate, isobornyl acrylate, isobornyl methacrylate, dicyclopentenyl acrylate, dicyclopentenyl methacrylate, and hydroxyethyl(meth)acrylate; esters of acrylic acid or methacrylic acid and a polyhydric alcohol; and polyhydric alcohols, such as glycerol, 1,1,1-trimethylolpropane, trihydroxyethyl isocyanurate, erythritol, and pentaerythritol. Examples of the water-soluble polyfunctional (meth)acrylamide include hydroxyethyl (meth)acrylamide, (meth)acryloylmorpholine, diethyl (meth)acrylamide, and dimethylaminopropyl (meth)acrylamide.

An optical film in which the curable composition of the present invention is used as an adhesive layer is not particularly restricted with regard to the shape thereof and, for example, the optical film usually has various layers, such as an undercoating layer, antireflection layer, a hard coat layer, a lubricating layer, a protective layer and a liquid-crystal layer, that are arranged as required on a transparent support. Examples of a method of arranging an adhesive layer on an optical film include (1) a method of coating the adhesive layer onto a transparent support, and (2) a method of arranging the adhesive layer between two arbitrary adjacent layers that are selected from a transparent support and various optional layers.

EXAMPLES

The curable composition of present invention will now be described in more detail by way of Examples and Comparative Examples.

Examples 1 to 14 and Comparative Examples 1 to 6

Components are mixed in accordance with the respective formulations shown in [Table 1] to [Table 3] and subsequently stirred for 1 hour at room temperature, after which the resultants were each filtered through a 1-μm filter to obtain curable compositions of Examples and Comparative Examples. It is noted here that, in Examples and Comparative Examples, the term "part(s)" means "part(s) by mass". The added amounts of PV-1 to PV-4 and PV'-1 to PV'-3 shown in [Table 1] to [Table 3] indicate the ratios (% by mass) of the respective components other than solvent. Further, PV'-1 to PV'-3 were each prepared by the following procedure.

Production Example

Preparation of Aqueous Water-Soluble Polymer Solutions PV'-1 to PV'-3

First, to 90.0 g of ion-exchanged water being stirred at room temperature, 10.0 g of each of the below-described comparative water-soluble polymers (B'-1, B'-2 and B'-3) was slowly added. The resultants were each stirred at room temperature for 1 hour and subsequently heated until the inner temperature reached 85 to 90° C., after which stirring was continued at this temperature for 2 hours. After confirming that each comparative water-soluble polymer was dissolved, the resulting solutions were each cooled to room temperature. Thereafter, the thus prepared aqueous solutions were each filtered through a 1-μm filter.

B'-1: GOHSENOL™ NL-05, manufactured by The Nippon Synthetic Chemical Industry Co., Ltd.

B'-2: G-Polymer™ OKS-1083, manufactured by The Nippon Synthetic Chemical Industry Co., Ltd.

B'-3: GOHSENX™ Z-200, manufactured by The Nippon Synthetic Chemical Industry Co., Ltd.

For the curable compositions obtained in Examples 1 to 14 and Comparative Examples 1 to 6, solution compatibility, coatability, photolithographic properties and a VHR were evaluated in accordance with the below-described procedures. The results thereof are also shown in [Table 1] to [Table 3].

(Solution Compatibility)

The state of each aqueous solution of the curable compositions obtained in Examples 1 to 14 and Comparative Examples 1 to 6 was visually checked in a transparent sample bottle. The evaluation criteria were as follows.

○: transparent and uniform
Δ: slightly turbid
x: turbid, separated, or observation of precipitates An aqueous solution with an evaluation of ○ or Δ has excellent storage stability and can thus be preferably used as a curable composition, and an aqueous solution with an evaluation of ○ is particularly preferred. An aqueous solution with an evaluation of x has poor storage stability and is thus not preferred as a curable composition.

(Coatability)

The curable compositions obtained in Examples 1 to 14 and Comparative Examples 1 to 6 were each coated on a glass substrate using a spin coater, and the resultants were each prebaked on a 90° C. hot plate for 5 minutes. The state of each film formed in this process was checked. It is noted here that the spin-coating conditions were adjusted such that the thickness of each film was measured to be 5.0 to 5.5 μm by a stylus method. The evaluation criteria were as follows.

○: transparent and uniform
Δ: slightly turbid
x: turbid or observation of precipitates A curable composition with an evaluation of ○ or Δ can be preferably used in an optical material, and a curable composition with an evaluation of ○ is particularly preferred. A curable composition with an evaluation of x is not preferred as a curable composition to be used in an optical material.

(Photolithographic Properties)

a) Exposure

On a pre-baked substrate, each coating film was irradiated with a light containing a wavelength of 365 nm through a photomask (line/space=100 μm/100 μm) at 1,000 mJ/cm$^2$ using a high-pressure mercury lamp.

b) Development and Drying

Each film exposed in a) was immersed in 23° C. ion exchanged water for 1 minute, and water adhering thereto was subsequently removed using an air gun, followed by 10-minute drying of the substrate in a 120° C. oven. After the development and drying, the resulting pattern was observed under a laser microscope to evaluate the photolithographic properties. The evaluation criteria were as follows.

○: The pattern had a resolution within 100±5 μm.
Δ: The pattern had a resolution within 100±10 μm.
x: The pattern had a resolution of 100±10 μm or larger, or the pattern disappeared.

A curable composition with an evaluation of ○ or Δ can be preferably used as a curable composition for which photolithographic properties are required, and a curable composition with an evaluation of ○ is particularly preferred. A curable composition with an evaluation of x is not preferred as a curable composition for which photolithographic properties are required.

(VHR)

Liquid-crystal compositions composed of the liquid-crystal compounds No. 1 to No. 11 shown below were each brought into contact with the respective coating films obtained in the above-described coatability test and, after leaving the resultants at 60° C. for 24 hours, the liquid-crystal compositions were each removed, whereby a resin elution test was performed. For the thus removed liquid-crystal compositions, the VHR (voltage holding ratio) was compared before and after the resin elution test to determine the VHR reduction rate, which was evaluated based on the below-described criteria. For the evaluation, the liquid-crystal compositions were each injected into a TN cell for liquid-crystal evaluation (cell thickness: 5 μm, electrode area: 8 mm×8 mm, alignment film: JALS2096), and the VHR was measured using VHR-1A (manufactured by TOYO Corporation) (Measurement conditions: pulse voltage width=60 μs, frame period=1.0 s, amplitude=±5 V, and measuring temperature=25° C.).

○: The VHR reduction rate was higher than 99%.
Δ: The VHR reduction rate was 97 to 99%.
x: The VHR reduction rate was lower than 97%.

A liquid-crystal composition with an evaluation of ○ or Δ exhibits low resin elution to liquid crystal and can thus be preferably used as a curable composition having excellent resin elution properties, and a liquid-crystal composition with an evaluation of ○ is particularly preferred. A liquid-crystal composition with an evaluation of x is not preferred because of high resin elution to liquid crystal.

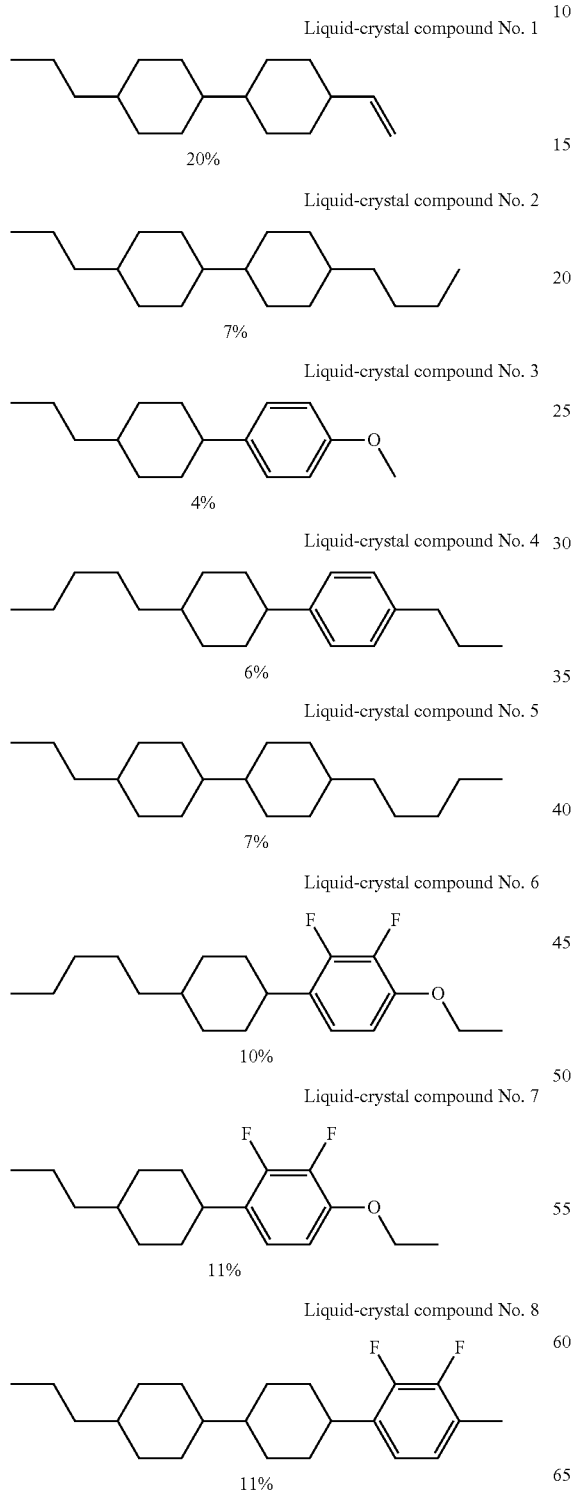
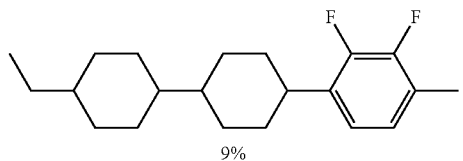
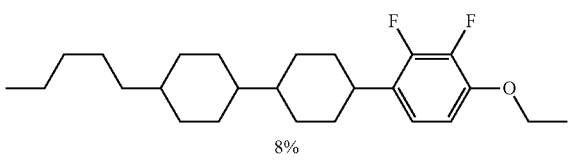
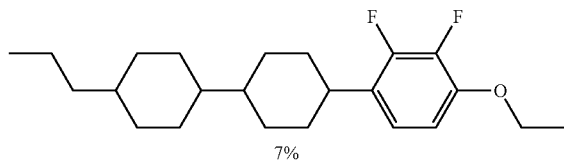

TABLE 1

|  | Example 1 | Example 2 | Example 3 | Example 4 | Example 5 | Example 6 | Example 7 |
|---|---|---|---|---|---|---|---|
| PV-1 | 30 | — | 30 | 40 | 30 | 70 | — |
| PV-2 | — | — | — | 30 | — | — | — |
| PV-3 | — | 20 | — | — | — | — | 10 |
| PV-4 | — | — | — | — | — | — | — |
| PV'-1 | 50 | — | — | — | 30 | — | — |
| PV'-2 | — | 60 | — | — | — | — | — |
| PV'-3 | — | — | 60 | — | — | — | 80 |
| A-1 | — | — | 2 | — | 10 | — | — |
| A-2 | 10 | — | 3 | — | 10 | — | — |
| A-3 | 10 | 10 | 5 | 10 | 10 | 10 | 5 |
| A-4 | — | 10 | — | — | — | — | — |
| A-5 | — | — | — | 10 | 10 | 10 | — |
| A-6 | — | — | — | 10 | — | 10 | 5 |
| A'-1 | — | — | — | — | — | — | — |
| A'-2 | — | — | — | — | — | — | — |
| A'-3 | — | — | — | — | — | — | — |
| C-1 | 2 | — | — | — | 2 | — | — |
| C-2 | — | — | — | — | 2 | — | — |
| C-3 | — | 2 | 2 | 3 | — | — | 2 |
| C-4 | — | — | — | — | — | — | — |
| C-5 | — | — | — | — | — | — | — |
| C-6 | — | — | — | — | — | 2 | — |
| C-7 | — | — | — | — | — | — | — |
| C-8 | — | — | — | — | — | — | — |
| C-9 | — | — | — | — | — | — | — |
| Solution compatibility | ○ | ○ | ○ | ○ | ○ | ○ | ○ |

TABLE 1-continued

|  | Example 1 | Example 2 | Example 3 | Example 4 | Example 5 | Example 6 | Example 7 |
|---|---|---|---|---|---|---|---|
| Coatability | ○ | ○ | ○ | ○ | ○ | ○ | ○ |
| Photolithographic properties | ○ | ○ | ○ | ○ | Δ | Δ | ○ |
| VHR | ○ | ○ | Δ | ○ | Δ | ○ | ○ |

A-1: NK ESTER A-600 (water-soluble polyfunctional acrylate), manufactured by Shin Nakamura Chemical Co., Ltd.,
A-2: ND ESTER A-GLY-20E (water-soluble polyfunctional acrylate), manufactured by Shin Nakamura Chemical Co., Ltd.,
A-3: NK ECONOMER A-PG5054E (water-soluble polyfunctional acrylate), manufactured by Shin Nakamura Chemical Co., Ltd.,
A-4: NK ESTER A-BPE-30 (water-soluble polyfunctional acrylate), manufactured by Shin Nakamura Chemical Co., Ltd.,
A-5: FFM-2 (water-soluble polyfunctional acrylamide), manufactured by FUJIFILM Corporation,
A-6: NK ESTER ATM-35E (water-soluble polyfunctional acrylate), manufactured by Shin Nakamura Chemical Co., Ltd.,
A'-1: NK ESTER A-400 (non-water-soluble polyfunctional acrylate), manufactured by Shin Nakamura Chemical Co., Ltd.,
A'-2: NK ESTER A-BPE-4 (non-water-soluble polyfunctional acrylate), manufactured by Shin Nakamura Chemical Co., Ltd.,
A'-3: hydroxyethylacrylamide (HEAA)(water-soluble monofunctional acrylamide), manufactured by KJ Chemicals Corporation,
PV-1: an aqueous solution prepared by allowing N-methylolacrylamide to act on GOHSENOL™ GL-05 and adjusting the solid content to be 10% by mass,
PV-2: an aqueous solution prepared by allowing N-methylolacrylamide to act on G-Polymer™ OKS-1083 and adjusting the solid content to be 10% by mass,
PV-3: an aqueous solution prepared by allowing formylstyrylpyridinium to act on G-Polymer™ OKS-1083 and adjusting the solid content to be 10% by mass,
PV-4: an aqueous solution prepared by allowing formylstyrylpyridinium to act on GOHSENOL™ GL-05 and adjusting the solid content to be 10% by mass,

C-1:

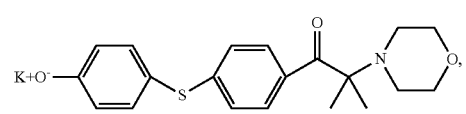

C-2:

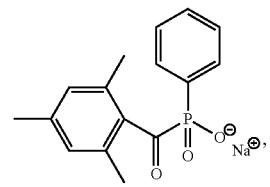 [SMILES: Cc1cc(C)c(C(=O)P(=O)([O-])c2ccccc2)c(C)c1 ; [Na+]]

C-3:

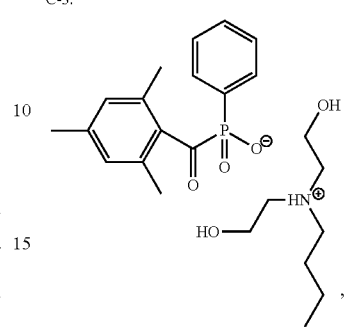

C-4:

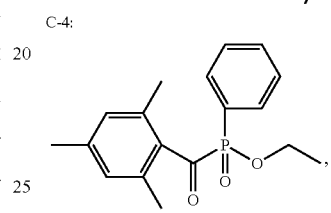

C-5: IRGACURE® 907, manufactured by BASF Japan Ltd.,
C-6: IRGACURE® 2959, manufactured by BASF Japan Ltd.,

C-7:

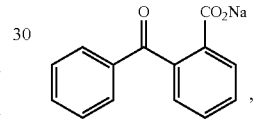

C-8:

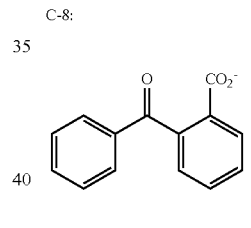

, and

C-9:

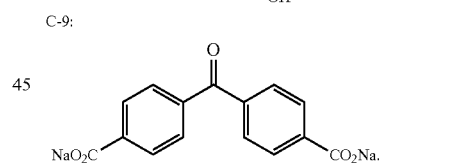

TABLE 2

|  | Example 8 | Example 9 | Example 10 | Example 11 | Example 12 | Example 13 | Example 14 |
|---|---|---|---|---|---|---|---|
| PV-1 | — | 80 | 40 | 40 | 40 | 40 | 40 |
| PV-2 | — | — | 30 | 40 | 40 | 40 | 40 |
| PV-3 | — | — | — | — | — | — | — |
| PV-4 | 10 | — | — | — | — | — | — |
| PV'-1 | — | — | — | — | — | — | — |
| PV'-2 | — | — | — | — | — | — | — |
| PV'-3 | 80 | — | — | — | — | — | — |
| A-1 | — | — | — | — | — | — | — |
| A-2 | — | 10 | 20 | — | — | — | — |
| A-3 | 5 | 5 | 10 | — | — | — | — |
| A-4 | — | — | — | — | — | — | — |
| A-5 | — | — | — | 15 | 10 | 10 | 10 |
| A-6 | 5 | 5 | — | — | — | — | — |

TABLE 2-continued

|  | Example 8 | Example 9 | Example 10 | Example 11 | Example 12 | Example 13 | Example 14 |
|---|---|---|---|---|---|---|---|
| A'-1 | — | — | — | — | — | — | — |
| A'-2 | — | — | — | — | — | — | — |
| A'-3 | — | — | — | 5 | 10 | 10 | 10 |
| C-1 | — | — | — | — | — | — | — |
| C-2 | — | — | — | — | — | — | — |
| C-3 | 2 | 5 | 5 | 5 | — | — | — |
| C-4 | — | — | — | — | — | — | — |
| C-5 | — | — | — | — | — | — | — |
| C-6 | — | — | — | — | — | — | — |
| C-7 | — | — | — | — | 5 | — | — |
| C-8 | — | — | — | — | — | 5 | — |
| C-9 | — | — | — | — | — | — | 5 |
| Solution compatibility | ○ | ○ | ○ | ○ | ○ | ○ | Δ |
| Coatability | Δ | ○ | ○ | ○ | ○ | ○ | ○ |
| Photolithographic properties | ○ | ○ | ○ | ○ | Δ | ○ | ○ |
| VHR | ○ | ○ | ○ | ○ | ○ | ○ | ○ |

TABLE 3

|  | Comparative Example 1 | Comparative Example 2 | Comparative Example 3 | Comparative Example 4 | Comparative Example 5 | Comparative Example 6 |
|---|---|---|---|---|---|---|
| PV-1 | — | — | 30 | — | 40 | — |
| PV-2 | — | — | — | — | 40 | — |
| PV-3 | — | — | — | — | — | — |
| PV-4 | — | — | — | — | — | — |
| PV'-1 | 60 | 30 | 50 | 60 | — | — |
| PV'-2 | 20 | 30 | — | — | — | 30 |
| PV'-3 | — | — | — | — | — | 30 |
| A-1 | — | 10 | — | — | — | 10 |
| A-2 | — | — | — | 10 | — | — |
| A-3 | — | — | — | 10 | — | — |
| A-4 | — | — | — | — | — | 10 |
| A-5 | — | — | — | — | — | 10 |
| A-6 | — | — | — | — | — | 10 |
| A'-1 | 10 | 20 | 10 | 10 | — | — |
| A'-2 | 10 | 10 | 10 | 10 | — | — |
| A'-3 | — | — | — | — | 20 | — |
| C-1 | — | — | — | — | — | — |
| C-2 | — | — | — | 2 | — | — |
| C-3 | 2 | — | — | — | 5 | — |
| C-4 | — | — | 2 | — | — | 2 |
| C-5 | — | 2 | — | — | — | — |
| C-6 | — | — | — | — | — | — |
| C-7 | — | — | — | — | — | — |
| C-8 | — | — | — | — | — | — |
| C-9 | — | — | — | — | — | — |
| Solution compatibility | Δ | x | Δ | x | ○ | Δ |
| Coatability | x | x | x | x | ○ | Δ |
| Photolithographic properties | x | x | Δ | Δ | x | x |
| VHR | x | x | Δ | x | ○ | ○ |

From [Table 1] to [Table 3], it is seen that the curable composition of the present invention has excellent coatability, resin elution properties and the like. Therefore, the curable composition of the present invention can be suitably used as an adhesive.

The invention claimed is:

1. A curable composition comprising:
(A) at least one selected from the group consisting of water-soluble polyfunctional (meth)acrylamides, wherein the water-soluble polyfunctional (meth)acrylamides are represented by the following Formula (II); and
(B) a photosensitive group-containing water-soluble polymer, wherein the water-soluble polymer comprises a structural unit represented b the following Formula (III) or (IV);

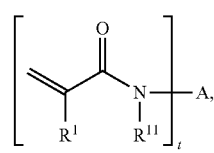

(II)

wherein in Formulae (II):
R¹ represents a hydrogen atom, a methyl group, or a halogen atom;
R¹¹ represents a hydrogen atom or an alkyl group having 1 to 4 carbon atoms;
A represents an n-valent organic group; and
t represents a number of 2 to 12;

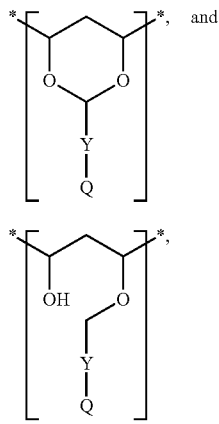

wherein in Formulae (III) and (IV):
Y represents a divalent organic group; and
Q is a vinyl group, an allyl group, a styryl group, a cinnamyl group, a cinnamoyl group, a cinnamylidene group, a cinnamylidenecetyl group, a chalcone group, a coumarin group, an isocoumarin group, a 2,5-dimethoxystilbene group, a maleimide group, an α-phenylmaleimide group, a 2-pyrone group, an azide group, a thymine group, a quinone group, a maleimide group, a uracil group, a pyrimidine group, a stilbazolium group, a styrylpyridinium group a styrylquinolium group, an epoxy group, an oxetane group, a vinyl ether group, an allyl ether group, an acetylacetone structure, or a β-diketone structure.

2. The curable composition according to claim 1, wherein the (B) photosensitive group-containing water-soluble polymer is a water-soluble polymer comprising a structural unit represented by the following Formula (V):

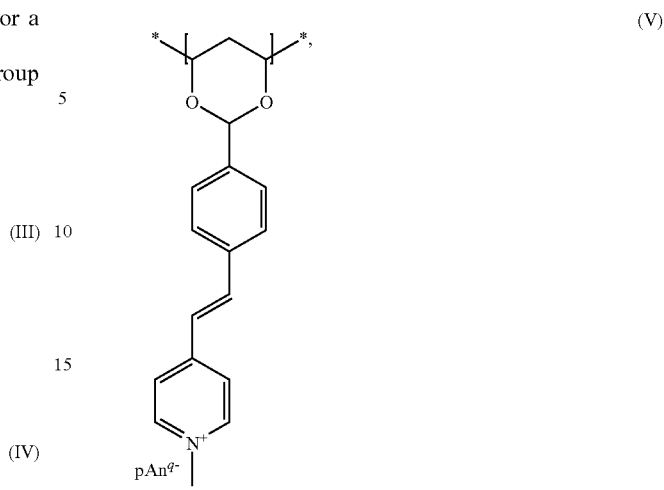

where $An^{q-}$ represents a q-valent anion; q represents 1 or 2; and p represents a coefficient that maintains a neutral charge.

3. The curable composition according to claim 2, further comprising a radical initiator.

4. The curable composition according to claim 1, wherein the (B) photosensitive group-containing water-soluble polymer is a polyvinyl alcohol derivative obtained by introducing a (meth)acrylate or (meth)acrylamide structure to a polyvinyl alcohol.

5. The curable composition according to claim 4, further comprising a radical initiator.

6. The curable composition according to claim 1, further comprising a radical initiator.

7. The curable composition of claim 1, wherein a mass ratio of component (A) to component (B) ((A)/(B)) is from 5:95 to 50:50.

8. The curable composition of claim 1, wherein a mass ratio of component (A) to component (B) ((A)/(B)) is from 5:95 to 30:70.

9. A cured product obtained by curing the curable composition according to claim 1.

10. A curing method comprising curing the curable composition according to claim 1 with an active energy ray.

* * * * *